(12) United States Patent
Yanagisawa

(10) Patent No.: US 6,367,529 B1
(45) Date of Patent: Apr. 9, 2002

(54) METHOD OF ADHERING WAFERS AND WAFER ADHERING DEVICE

(75) Inventor: Toshihisa Yanagisawa, Nagano (JP)

(73) Assignee: Fujikoshi Kikai Kogyo Kabushiki Kaisha, Nagano (JP)

(*) Notice: Subject to any disclaimer, the term of this patent is extended or adjusted under 35 U.S.C. 154(b) by 0 days.

(21) Appl. No.: 09/299,448

(22) Filed: Apr. 26, 1999

(30) Foreign Application Priority Data

May 1, 1998 (JP) .......................................... 10-122220
Sep. 11, 1998 (JP) .......................................... 10-258612

(51) Int. Cl.$^7$ .......................... G05G 15/02; B32B 31/00
(52) U.S. Cl. ..................... 156/350; 156/299; 156/358; 156/560; 340/686.5; 269/63
(58) Field of Search ............................... 156/299, 350, 156/358, 556, 560; 269/63; 340/686.5

(56) References Cited

U.S. PATENT DOCUMENTS

| | | | | |
|---|---|---|---|---|
| 4,104,099 A | * | 8/1978 | Scherrer | .................. 156/155 |
| 4,239,567 A | * | 12/1980 | Winings | ..................... 156/154 |
| 4,960,485 A | * | 10/1990 | Ichinose et al. | ............ 156/556 |
| 5,070,288 A | * | 12/1991 | Ikeda et al. | ................. 318/618 |
| 5,248,024 A | | 9/1993 | Yokosuka | |

* cited by examiner

*Primary Examiner*—Mark A. Osele
(74) *Attorney, Agent, or Firm*—Jordan and Hamburg LLP (57) ABSTRACT

The method and the device of the present invention are capable of uniformly using whole surface of a carrying plate, improving the polishing accuracy of wafers and extending span of life of the carrying plate. The method of adhering a plurality of wafers onto a surface of a carrying plate with predetermined spaces is characterized by regularly shifting wafer adhering positions, at which the wafers are respectively adhered, with respect to a standard position of the carrying plate, in the surface of the carrying plate. The wafer adhering position is regularly shifted when the carrying plate is exchanged or predetermined time elapses.

17 Claims, 5 Drawing Sheets

METHOD OF ADHERING WAFERS AND WAFER ADHERING DEVICE

BACKGROUND OF THE INVENTION

The present invention relates to a method of adhering wafers, e.g., silicon wafers, onto a carrying plate of a surface polishing machine with an adhesive or water and an wafer adhering device for said method.

In a wafer polishing machine, wafers are adhered onto a tough plate called a carrying plate so as to handle wafers. Surfaces of the wafers, which have been adhered on the carrying plate, are polished by a polishing unit. Wafers are thin, so they are apt to be curved and it is difficult for wafers to maintain flat. By holding wafers on the carrying plate, they can be maintained flat and polished properly.

To polish and make surfaces of wafers highly flat, wafers are required to be highly flatly adhered onto the carrying plate, and the surface of the carrying plate must be highly flat. Especially, in the case of polishing silicon wafers, a plurality of silicon wafers, which have been adhered on the polishing plate, are pressed onto a polishing plate, then the carrying plate and the polishing plate are relatively moved to polish surfaces of the silicon wafers. Accuracy of flatness of the silicon wafers and the surface of the carrying plate should be high, e.g., submicron order.

The polished wafers are peeled from the carrying plate and conveyed to the next step. The carrying plate is washed to reuse many times. Therefore, carrying plates should have higher durability, so they are made of tough and durable materials, e.g., ceramics.

Note that, in the case of adhering wafers with an adhesive, e.g., wax, the wafer is adhered onto the surface of the carrying plate by the steps of: dropping the wax onto a surface of the wafer; spinning the wafer so as to uniformly coat the whole surface of the wafer; inverting the wafer; and adhering the wafer onto the surface of the carrying plate.

Conventionally, wafer adhering positions, at which a plurality of wafers are respectively adhered, on the circular carrying plate are separated with regular angular spaces. In one case, a first wafer adhering position, from which the first wafer is adhered, is not defined on the carrying plate; in another case, the first wafer adhering position is defined thereon and wafers are adhered on the fixed wafer adhering positions in predetermined order. If wafers are adhered at the fixed positions in predetermined order, wafers can be polished, at each wafer adhering position, under the same adhering condition. By polishing under the same condition, tendency of polishing accuracy at each wafer adhering position can be known, so the polishing accuracy, etc. can be easily controlled.

However, in the case of adhering wafers at the fixed wafer adhering positions in the surface of the carrying plate, a surface condition of the fixed wafer adhering positions will be quite different from that of other parts of the carrying plate because of chemical agents. Namely, the wafer adhering positions of the carrying plate are usually coated with the adhesive; other parts thereof are exposed in a liquid abrasive, e.g., slurry. The parts exposed in the abrasive are eroded by the abrasive, so surface condition between the wafer adhering positions and other parts are quite different.

Since the surface condition is partially different in the carrying plate, the partial difference badly influences the polishing accuracy, and maintenance of the carrying plate is frequently required.

As described above, the tendency of the polishing accuracy at each wafer adhering position can be known by adhering wafers at the fixed wafer adhering positions in predetermined order, and the polishing accuracy can be easily controlled. But, if the surface condition of one of the wafer adhering positions is bad, wafer adhered at the bad adhering position are always badly polished, and manufacturing efficiency must be lower.

On the other hand, if the first wafer adhering position is not defined on the carrying plate or wafers are freely adhered thereon, the polishing accuracy at each wafer adhering position cannot be controlled at all, so that the flatness of the surface of the carrying plate is made worse and the polishing accuracy is made lower.

If wafers are freely adhered onto the surface of the carrying plate, the surface of the carrying plate is not uniformly used, so that said difference between the wafer adhering positions and other parts is apt to be occurred. Thus, the flatness of the surface of the carrying plate must be frequently corrected. The whole surface of the carrying plate cannot be used properly, and span of life of the carrying plate will be shorter.

In the case of adhering wafers at the fixed wafer adhering positions, a standard position of the carrying plate must be detected by detecting a mark of the carrying plate. But the mark cannot be detected efficiently, so manufacturing efficiency cannot be improved.

SUMMARY OF THE INVENTION

An object of the present invention is to provide a method of adhering wafers and a wafer adhering device, which are capable of uniformly using whole surface of a carrying plate, improving the polishing accuracy of wafers and extending span of life of the carrying plate.

Another object of the present invention is to provide a wafer adhering device, which is capable of quickly detecting a standard position of the carrying plate and improving the manufacturing efficiency.

To achieve the objects, the present invention has following structures.

In the present invention, the method of adhering a plurality of wafers onto a surface of a carrying plate with predetermined spaces is characterized by, regularly shifting wafer adhering positions, at which said wafers are respectively adhered, with respect to a standard position of the carrying plate.

In the method, the carrying plate may be a circular plate, the wafers may be initially adhered at initial adhering positions on the surface of the circular carrying plate with regular angular spaces, and the wafer adhering positions may be respectively returned to their initial adhering positions when each wafer adhering position reaches the adjacent initial wafer adhering position. With this feature, the wafer adhering positions can be properly angularly shifted, and angle of shifting the wafer adhering positions can be minimum so manufacturing efficiency can be improved.

The wafer adhering device for adhering a plurality of wafers onto a surface of a carrying plate with predetermined spaces, comprises:

an adhering head positioning the wafers at wafer adhering positions in the surface of the carrying plate, the adhering head pressing the wafers onto the carrying plate;

an adjusting mechanism being capable of adjusting relative positional relationship between the adhering head and the carrying plate;

a mark being provided at a standard position of the carrying plate;

a sensor detecting the mark; and a control unit detecting the standard position of the carrying plate by the sensor, the control unit controlling the adjusting mechanism so as to regularly shifting the wafer adhering positions with respect to the standard position of the carrying plate.

In the device, the mark may include an identification code for individually identifying the carrying plate. With this feature, a plurality of carrying plates can be properly managed.

In the device, the identifying mechanism may include a rotary table holding and rotating the carrying plate. With this simple structure, wafers can be adhered at desired positions.

Further, the wafer adhering device for adhering a plurality of wafers onto a surface of a carrying plate with predetermined spaces, comprises:

an adhering head positioning the wafers at wafer adhering positions in the surface of the carrying plate, the adhering head pressing the wafers onto the carrying plate;

a rotary mechanism including a rotary table for holding and rotating the carrying plate, the rotary mechanism being capable of detecting and adjusting relative positional relationship, in the circumferential direction of the carrying plate, between the adhering head and the carrying plate;

a mark being provided at a standard position of the carrying plate;

a plurality of mark detecting means for detecting the mark; and a control unit detecting the standard position of the carrying plate by one of the mark detecting means, the control unit controlling the rotary mechanism so as to indexing the wafer adhering positions on the carrying plate.

In the device, even-number of the mark detecting means may be symmetrically arranged with respect to the carrying plate. With this feature, the wafer adhering positions can be indexed efficiently.

In the present invention, the wafer adhering positions are regularly shifted, with respect to the standard position of the carrying plate, in the surface of the carrying plate, so that the wafer adhering positions can be properly managed. The whole surface of the carrying plate can be uniformly used, so that the surface conditions of the wafer adhering positions, which are regularly shifted, can be uniformly maintained. Therefore, wafers can be stably adhered on the carrying plate, the polishing accuracy of the wafers can be improved, and the span of life of the carrying plate can be extended.

Further, by employing a plurality of mark detecting means, the mark can be quickly detected by one of the mark detecting means and the wafer adhering positions can be quickly indexed. Therefore, the wafer adhering positions in the surface of the carrying plate can be efficiently indexed, and the manufacturing efficiency can be improved.

BRIEF DESCRIPTION OF THE DRAWINGS

Embodiments of the present invention will now be described by way of examples and with reference to the accompanying drawings, in which.

DETAILED DESCRIPTION OF THE PREFERRED EMBODIMENTS

Preferred embodiments of the present invention will now be described in detail with reference to the accompanying drawings. In the following embodiments, wafers to be polished are silicon wafers for manufacturing semiconductor chips.

(First Embodiment)

Figure 1:
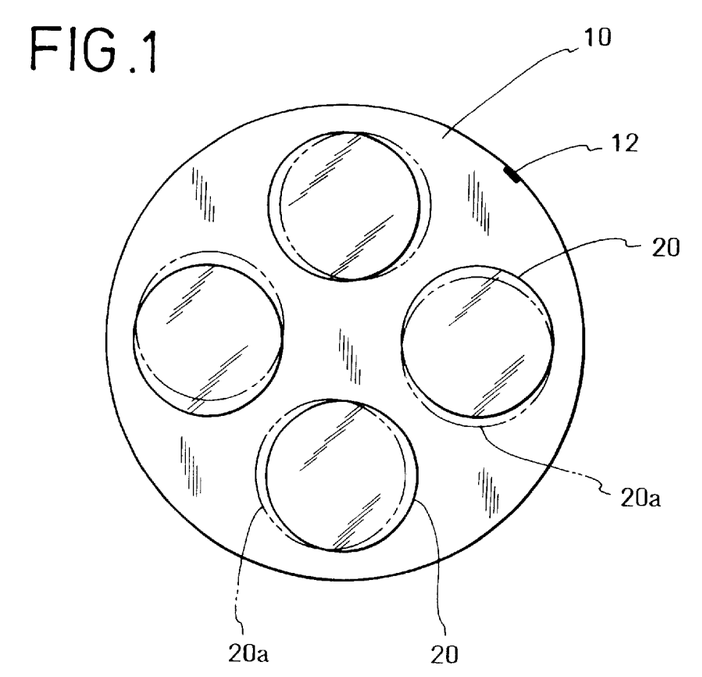
FIG. 1 is a plan view of a carrying plate, in which wafers are adhered by the method of First Embodiment of the present invention.

FIG. 1 is a plan view of a carrying plate, in which wafers are adhered by the method of First Embodiment.

A plurality of wafers 20 are adhered on a front surface of a circular carrying plate 10. A mark 12 is provided at a standard position of the carrying plate 10. In the present embodiment, the mark 12 is formed by grooving an outer circumferential face of the carrying plate 10. The mark 12 is grooved from a rear surface to the front surface by proper means, e.g., laser.

In FIG. 1, the wafers 20 shown by solid lines are adhered at wafer adhering positions for the first wafer adhering operation; the wafers shown by two-dot chain lines 20a are adhered at wafer adhering positions for the second wafer adhering operation. In the present embodiment, the wafer adhering positions are gradually angularly shifted for each wafer adhering operation.

Note that, in the present embodiment, three or more wafers 20, preferably five or more, are adhered on the carrying plate 10, so that stable polishing operation can be executed and polishing accuracy can be improved.

As described in BACKGROUND OF THE INVENTION, the carrying plate 10 is generally made of a tough and durable ceramics, e.g., alumina ($Al_2O_3$).

Wafers 20 are adhered on the carrying plate 10 before polishing surfaces of the wafers 20. In the present embodiment, the wafer adhering positions with respect to the standard position of the carrying plate, which is defined by the mark 12, are regularly shifted.

By employing the method of the present embodiment, the wafer adhering positions can be properly managed. The whole surface of the carrying plate 10 can be uniformly used, so that the surface conditions of the carrying plate 10 can be uniformly maintained. Further, the wafer adhering positions are defined on the basis of the standard position, so that each wafer 20 can be easily identified and properly polished.

Now, action of a general wafer polishing machine will be explained as a premise.

In the wafer polishing machine, firstly a plurality of wafers are adhered onto the carrying plate with an adhesive, e.g., wax. The carrying plate holding the wafers are inverted and mounted onto a polishing plate, whose surface is covered with a polishing cloth. The wafers are pressed onto the polishing cloth together with the carrying plate. A liquid abrasive, e.g., slurry, is supplied onto the polishing cloth. The polishing plate is relatively moved with respect to the wafers to polish surfaces of the wafers. While polishing the wafers, the polishing plate is automatically operated, and the carrying plate, which is located on the polishing plate, is spun together with the wafers. The carrying plate is spinably held between, for example, a center roller, which is located at the center of the polishing plate, and a guide roller, which is located close to an outer edge of the polishing plate, so that the carrying plate is capable of spinning within a radius of the polishing plate. By spinning the polishing plate and the carrying plate, complex relative movement is generated therebetween and the surfaces of the wafers can be uniformly polished. After the wafers are polished, the polished wafers are taken out from the carrying plate and accommodated in a cassette. The carrying plate is washed by a brush or super sonic means, dried then conveyed to an adhering stage, at which wafers to be polished in the next polishing operation are adhered thereon, again. These steps constitute one cycle of the general polishing operation.

In the case of spinning the carrying plate 10, the carrying plate 10 should be formed into a circular plate. In the present embodiment, the wafers 20 are adhered on the carrying plate 10 with regular angular spaces, so that well-balanced operation can be executed.

In the present embodiment, the wafers are initially adhered at the initial adhering positions with regular angular spaces. In the next polishing cycle, the wafer adhering positions are shifted from the initial adhering positions. Namely, the wafer adhering positions are gradually shifted from the previous adhering positions. When each wafer adhering position reaches the adjacent initial adhering position, the wafer adhering positions are returned to the initial adhering positions. With this action, the wafer adhering positions can be properly angularly shifted, and angle of shifting the wafer adhering positions can be minimum so manufacturing efficiency can be improved. Namely, total shift-angle of each wafer adhering position with respect to the initial adhering position is equal to or less than the space-angle of the adjacent wafers adhered on the carrying plate. By shifting each wafer adjacent position until reaching the adjacent initial adhering position, the whole surface of the carrying plate can be uniformly used. Note that, each shift-angle of the wafer adhering position may be 1–3° but it is not limited.

(Second Embodiment)

Second Embodiment of shifting the wafer adhering positions will be explained.

In the present embodiment, a plurality of carrying plates 10 are supplied in order. And the wafer adhering positions are shifted when the carrying plate 10 is exchanged.

If a predetermined number of the carrying plates 10 are supplied, in prescribed order, within one cycle of the polishing operation, the wafer adhering positions of each carrying plate 10 can be properly shifted. In this case, the wafer adhering positions can be easily and properly shifted by simple control means, e.g., a sequensor. When the wafer 20 are peeled from the carrying plates 10, the action can be easily controlled by simple control means.

Next, a relationship between number of the carrying plates 10 "NC" and number of shifting the wafer adhering position "NS" between the adjacent initial adhering positions will be explained. Namely, the number "NC" cannot be divided by the number "NS" without a remainder. The number "NS" is got by the following formula: "NS"=(the space-angle between the adjacent initial adhering positions)/(the shif-angle). With this relationship, the wafers 20 are not repeatedly adhered at same positions in each carrying plate 10. For example, the number "NC" may be a multiple of the number "NS" plus one.

(Third Embodiment)

In Third Embodiment, identification means, e.g., bar code, is provided to the carrying plate 10 so as to identify each carrying plate 10. And, the wafer adhering positions are defined and shifted on the basis of history of the wafer adhering positions of the carrying plate 10. For example, number of using the carrying plate 10 is stored by a computer system, and the shift-angle of the wafer adhering positions are defined on the stored history (data) of the carrying plate 10.

With this control, the wafer adhering positions can be properly regularly shifted.

(Fourth Embodiment)

In Fourth Embodiment, the wafer adhering positions in the carrying plate 10 are shifted on the basis of proper number of wafers polished, e.g., lot number.

For example, while the first operation, prescribed lot number of the wafers 20 are polished with a plurality of the carrying plates 10, the wafer adhering positions of all the carrying plates 10 are same; while the second operation, the prescribed lot number of the wafers 20 are polished with the same carrying plates 10, the wafer adhering positions of all the carrying plates 10 are equally angularly shifted. With this control, the whole surface of each carrying plate 10 can be uniformly used.

In the present embodiment, the wafer adhering positions are shifted on the basis of the lot number of the wafers. But the wafer adhering positions may be shifted on the basis of prescribed period, e.g., hour(s), day(s).

(Fifth Embodiment)

Figure 2:
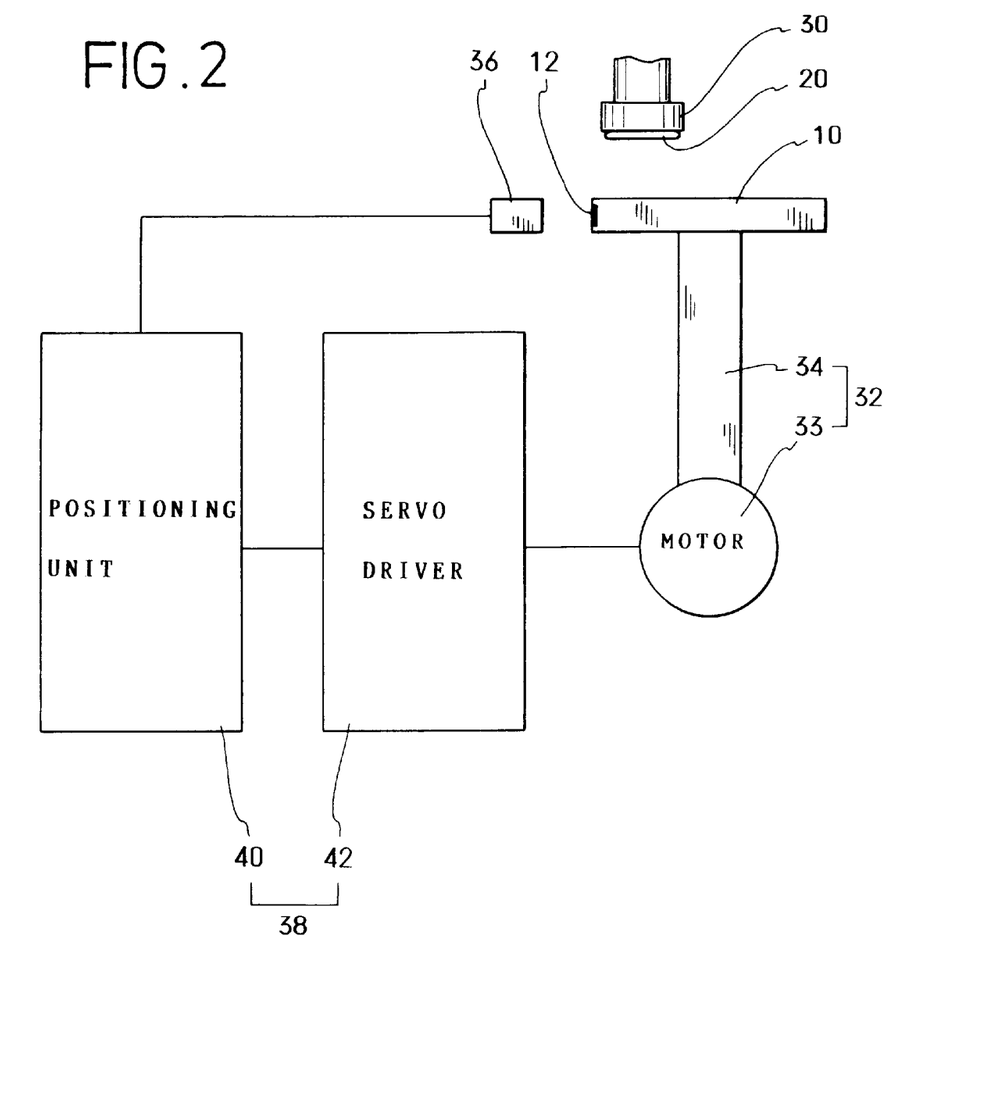
FIG. 2 is a block diagram of the wafer adhering device of Fifth Embodiment of the present invention.
Figure 3:
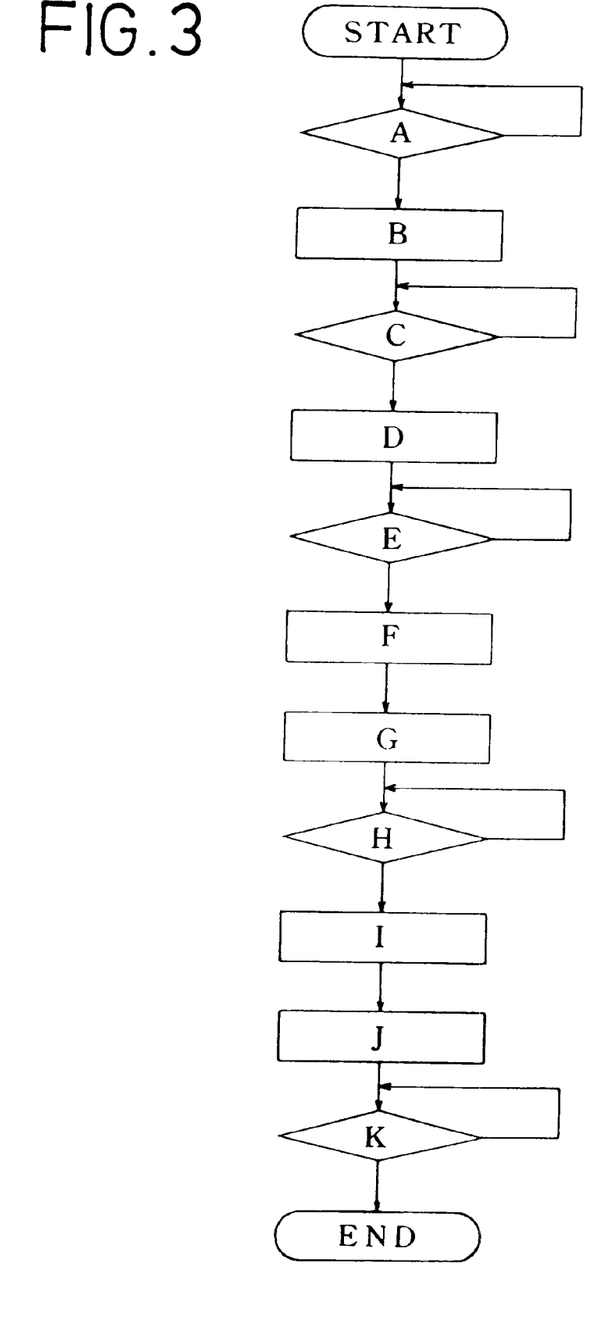
FIG. 3 is a flow chart showing steps of the method of the Fifth Embodiment.

An embodiment of the wafer adhering device of the present invention will be explained with reference to FIGS. 2 and 3. FIG. 2 is a block diagram of the wafer adhering device of the present embodiment; FIG. 3 is a flow chart showing steps of the present embodiment.

In the device, a plurality of the wafers 20 are adhered on the carrying plate 10 with regular angular spaces.

An adhering head 30 hold the wafer 20, mounts the wafer 20 onto the carrying plate 10, and presses and adheres the wafer 20 thereonto. In the present embodiment, the position of the adhering head 30 is fixed so as to adhere the wafers 20 at the same position.

To tightly adhere the wafers 20 onto the carrying plate 10, stamping means for pressing the wafer 20 on the carrying plate 10 toward the carrying plate 10 may be provided to the device.

A rotary table unit 32 is an example of an adjusting mechanism. The rotary table unit 32 is capable of supporting and holding the carrying plate 10 by air suction. Further, the rotary table unit 32 is capable of adjusting relative positional relationship between the adhering head 30 and the carrying plate 10.

A motor 33 for indexing the carrying table 10 may be a pulse motor or a servo motor. A rotary table 34 is rotated by the index motor 33. Thus, the rotary table unit 32 includes: the rotary table 34 for supporting and rotating the carrying table 10; and the index motor 33 for rotating the rotary table 34. In spite of the simple structure, the rotary table unit 32 is capable of properly controlling the rotational position of the carrying plate 10 and adhering the wafers 20 at desired positions on the carrying plate 10.

In the present invention, the adjusting mechanism is not limited to the rotary table unit 32. The carrying table may be supported by a fixed supporting table. In this case, the adhering head 30 is capable of moving in a two-dimensional plane so as to adhere the wafers 20 at desired positions.

The mark 12 includes an identification code to identify the carrying plate 10. The mark 12 may be formed by printing, grooving, inserting or attaching an identification member, etc. The mark 12 is provided at a proper position.

Since the mark 12 includes the identification code, a plurality of the carrying plates 10 can be individually managed. If the mark 12 has function of positioning and identifying the carrying plate 10, manufacturing cost of the carrying plate 10 can be reduced. Note that, the identification code may be bar codes, numeric codes, alphabets, etc., which are formed on the carrying plate 10 by printing, etc.

A sensor 36 detects the mark 12 of the carrying plate 10. A proper type of sensor may be selected, as the sensor 36, on the basis of the type of the mark 12. In the present embodiment, a photo sensor is employed as the sensor 36. Further, an image processing system capable of detecting the rotational position of the carrying plate 10 may be employed as the sensor 36.

A control unit 38 control the rotary table unit 32 so as to regularly shift the wafer adhering positions in the carrying plate 10 on the basis of the standard position, which is defined by the mark 12.

A positioning unit 40 outputs control signals on the basis of signals from the sensor 36. A servo driver 42 drives the index motor 33 on the basis of the control signals from the positioning unit 40.

With above described structure, the sensor 36 detects the mark 12 as the standard position of the carrying plate 10. The first wafer adhering position can be securely periodically shifted. Namely, the first wafer adhering position is regularly shifted when the carrying plate is exchanged or predetermined time (hour, day, etc.) elapses.

Next, the action of the device will be explained with reference to FIG. 3, which shows control steps of the control unit 38.

The flow chart of FIG. 3 shows the steps of: indexing the rotary table unit 32; detecting the mark 12; and angularly shifting the carrying plate to coincide the wafer adhering position of the first wafer 20 with a wafer adhering stage. Before executing the steps of FIG. 3, the carrying plate 10 was mounted on the rotary table (index stage) 34 and the center of the carrying plate 10 was detected. Then, the carrying plate 10 was held on the rotary table by air suction.

As shown in FIG. 3, firstly the control unit 38 check if an index command is inputted or not (Step "A"). If the index command is inputted, the carrying plate 10 is rotated, in the regular direction, by the rotary table 34 so as to detect the mark 12 (Step "B"). The rotary table 34 is rotated at high speed to improve manufacturing efficiency.

Next, the control unit 38 checks if the mark 12 is detected or not (Step "C"). If the mark 12 is detected, the rotation of the rotary table 34 is braked (Step "D"). Since the carrying plate 10 is also rotated at high speed, the mark 12 passes the sensor 36. Then, the control unit 38 checks if the sensor 36 detects no mark 12 or not (Step "E").

If the sensor 36 once detected the mark 12 then missed the mark 12, the rotation of the rotary table 34, on which the carrying plate 10 is held, is completely stopped (Step "F").

Next, the control unit 38 rotates the rotary table 34, in the reverse direction, at low speed (Step "G"). The control unit 38 checks if the mark 12 is detected or not (Step "H"). If the mark 12 is detected, the rotation of the rotary table 34 is stopped (Step "I"). Influence of inertia can be reduced by reducing the rotational speed of the rotary table 34 and the carrying plate 10. By rotating the carrying plate 10 at lower speed, the carrying plate 10 can be correctly stopped at desired position on the basis of the mark 12.

By the above described control, the mark 12 or the standard position of the carrying plate 10 can be quickly stopped at the desired position.

In Step "J", the carrying plate 10 is stayed at the present position or rotated (shifted) prescribed angle so as to coincide the first adhering position of the carrying plate 10 with the adhering head 30. Then, the control unit 38 checks if the first wafer 20 is correctly prepared or not (Step "K").

Upon completing the indexing action for the first wafer 20, the first wafer 20 is adhered onto the first initial wafer adhering position of the carrying plate 10 by the adhering head 30. To adhere the following wafers 20, the carrying table is rotated to index the initial wafer adhering positions of the following wafers 20. The following wafers 20 are respectively adhered onto the rest initial wafer adhering positions, in order, with regular angular spaces by the adhering head 30.

In the next cycle, the above described steps are repeated until the mark 12 or the standard position of the carrying plate 10 stops at the desired position. Then, the carrying plate 10 is angularly shifted the prescribed angle. With this action, the first wafer adhering position of the wafer 20a (see FIG. 1) is angularly shifted the prescribed angle from the first initial wafer adhering position of the prior cycle. The wafer adhering positions of the following wafers 20a are indexed, and the following wafers 20a are adhered thereonto as well as the first cycle.

By repeating the above described cycle, the wafer adhering positions, with respect to the standard position, can be regularly angularly shifted in the surface of the carrying plate 10.

By repeating the above described cycle, each wafer adhering position is gradually angularly shifted and reaches the adjacent initial wafer adhering position. When each wafer adhering position reaches the adjacent initial adhering position, the adhering positions are respectively returned to their initial adhering positions. By returning to the initial adhering positions, the wafers can be efficiently adhered.

In the wafer adhering device of the present embodiment, the wafers are adhered by the method of the First Embodiment, but the method of adhering is not limited to the First Embodiment. The methods of the Second to Fourth Embodiments can be employed in the present device. In the present device, the methods of the Second to Fourth Embodiments can be employed by changing a control program of the positioning unit 40.

By shifting the wafer adhering positions, the whole surface of the carrying plate 10 can be used. So the present embodiment has following advantages: the surface condition of the carrying plate 10 can be uniformly maintained; the span of life of the carrying plate 10 can be extended; the wafers 20 can be stably adhered; the wafer adhering action can be executed automatically; and the wafers 20 can be identified, by regularly shifted the wafer adhering positions in a prescribed pattern, so as to respectively manage the wafers.

(Sixth Embodiment)

Figure 4:
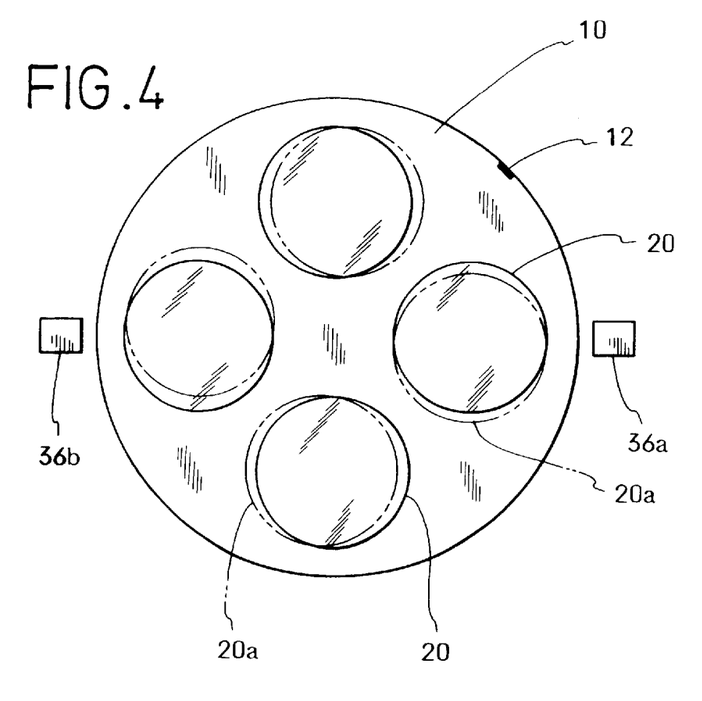
FIG. 4 is a plan view of the carrying plate, in which the wafers are adhered by the method of Sixth Embodiment.

FIG. 4 is a plan view of the carrying plate, in which the wafers are adhered by the method of Sixth Embodiment.

Note that, the members explained in the First Embodiment are assigned the same symbols and explanation will be omitted.

In the present embodiment, as well as the First Embodiment, the wafers 20 shown by solid lines are adhered at wafer adhering positions for the first wafer adhering operation; the wafers shown by two-dot chain lines 20a are adhered at wafer adhering positions for the second wafer adhering operation. In the present embodiment too, the wafer adhering positions are gradually angularly shifted for each wafer adhering operation.

The carrying plate 10 is rotatably held and the wafer adhering positions in the carrying plate are indexed by a rotary mechanism and a control unit.

Two sensors 36a and 36b are provided as mark detecting means. The sensors 36a and 36b are fixed to a base member. The sensors 36a and 36b are symmetrically provided with respect to the carrying plate 10.

The position of the mark 12 detected by one of the sensors 36a and 36b is the standard position for indexing the wafer adhering positions in the carrying plate 10.

In comparison with the device having one mark detecting means, the device of the present embodiment can detect the mark 12 while the carrying plate rotates 180° at the most, so the mark can be efficiently detected.

By symmetrically providing even-number of the sensors 36a and 36b, the wafer adhering positions can be highly efficiently detected.

Further, a plurality of the mark detecting means can be employed, without any other additional elements, by changing a program of the control unit only.

(Seventh Embodiment)

In the Sixth Embodiment, the wafer adhering positions are regularly shifted. But in the present embodiment, the wafer adhering positions are fixed on the surface of the carrying plate 10, so the wafer 20 are adhered on the fixed positions.

By adherng the wafers at fixed wafer adhering positions defined on the basis of the mark 12, the wafers can be polished under same conditions at each wafer adhering position, so that tendency of polishing accuracy of each wafer adhering position can be known.

By detecting the mark 12, the first wafer 20 can be always adhered at a fixed first wafer adhering position of the carrying plate 10. In the case of symmetrically providing two mark detecting means 36a and 36b with respect to the center of the carrying plate 10, if the mark detecting means 36a detects the mark 12, the first wafer adhering position is indexed on the basis of the position of the mark 12; if the mark detecting means 36b detects the mark 12, the first wafer adhering position is indexed on the basis of the position which is 180° regularly shifted from the mark 12.

In the present embodiment, the mark 12 or the fixed first wafer adhering position can be indexed by two mark detecting means 36a and 36b, so that required time for indexing the wafer adhering positions can be shortened and manufacturing efficiency can be improved.

(Eighth Embodiment)

Figure 5:
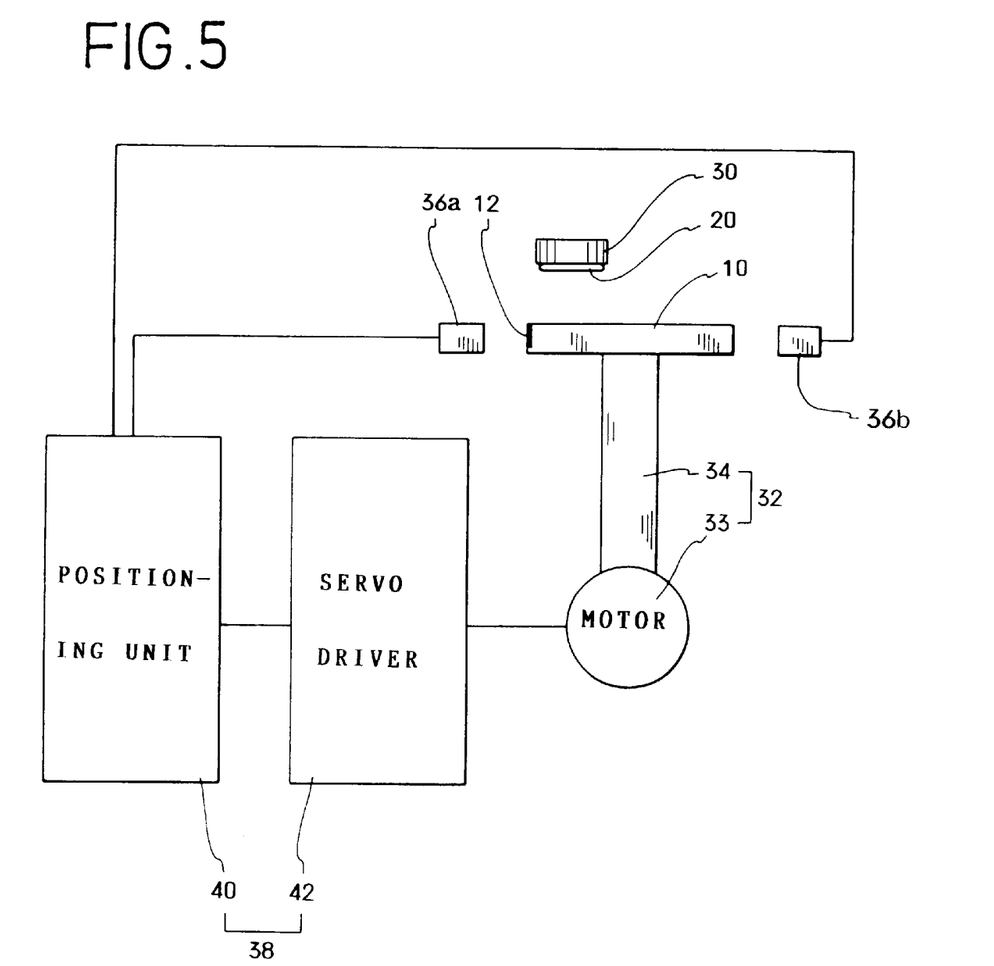
FIG. 5 is a block diagram of the wafer adhering device of Eighth Embodiment.
Figure 6:
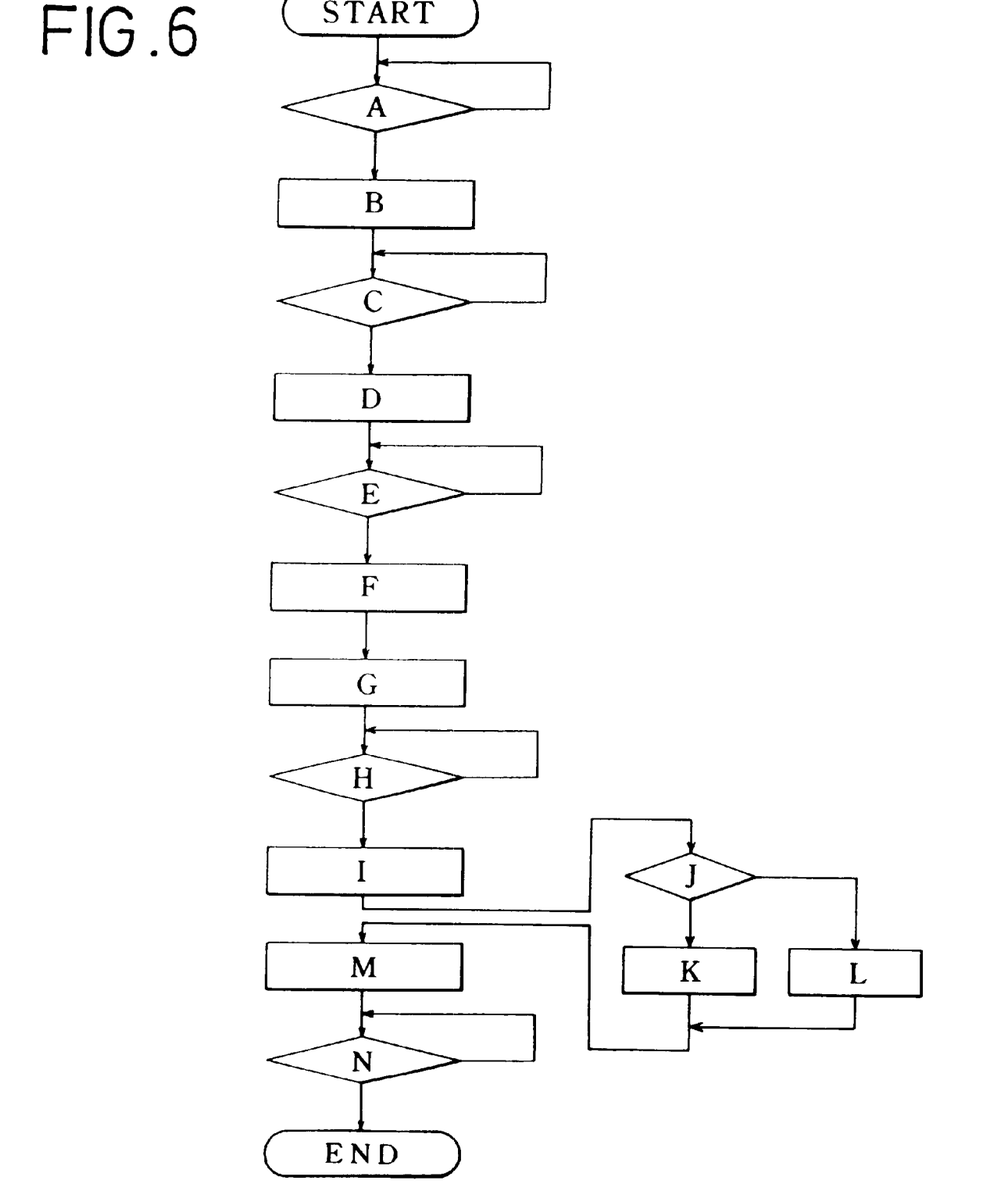
FIG. 6 is a flow chart showing steps of the method of the Eighth Embodiment.

The wafer adhering device of the present embodiment will be explained with reference to FIGS. 5 and 6. FIG. 5 is a block diagram of the wafer adhering device of the present embodiment; FIG. 6 is a flow chart showing steps of the present embodiment.

In the device, a plurality of the wafers 20 are adhered on the carrying plate 10 with regular angular spaces as well as the embodiment shown in FIG. 2. Note that, the members shown in FIG. 2 are assigned the same symbols and explanation will be omitted.

Sensors 36a and 36b detect the mark 12 of the carrying plate 10 as mark detecting means. The two sensors 36a and 36b are symmetrically provided with respect to the center of the carrying plate 10.

In the present embodiment, photo sensors are employed as the sensors 36a and 36b. Further, an image processing system capable of detecting the rotational position of the carrying plate 10 may be employed as the mark detecting means.

A control unit 38 control the rotary table unit 32 so as to index the wafer adhering positions in the carrying plate 10 on the basis of the standard position, which is defined by the mark 12. The control unit 38 is capable of easily controlling the rotary table unit 32 to define the fixed or shifted wafer adhering positions.

A positioning unit 40 outputs control signals on the basis of signals from one of the sensors 36a and 36b. A servo driver 42 drives the index motor 33 on the basis of the control signals from the positioning unit 40.

With above described structure, the two sensors 36a and 36b detect the mark 12 as the standard position of the carrying plate 10. The first wafer adhering position can be securely periodically shifted or fixed. In the case of shifting the first wafer adhering position, the first wafer adhering position is regularly shifted when the carrying plate is exchanged or predetermined time (hour, day, etc.) elapses.

Next, the action of the device of the Eighth Embodiment will be explained with reference to FIG. 6, which shows control steps of the control unit 38.

The flow chart of FIG. 6 shows the steps of: indexing the rotary table unit 32; detecting the mark 12; and angularly shifting the carrying plate to coincide the wafer adhering position of the first wafer 20 with a wafer adhering stage. Before executing the steps of FIG. 3, the carrying plate 10 was mounted on the rotary table (index stage) 34 and the center of the carrying plate 10 was detected. Then, the carrying plate 10 was held on the rotary table by air suction.

As shown in FIG. 6, firstly the control unit 38 check if an index command is inputted or not (Step "A"). If the index command is inputted, the carrying plate 10 is rotated, in the regular direction, by the rotary table 34 so as to detect the mark 12 (Step "B"). The rotary table 34 is rotated at high speed to improve manufacturing efficiency.

Next, the control unit 38 checks if the mark 12 is detected by one of the sensors 36a and 36b or not (Step "C"). If the mark 12 is detected by one of the sensors 36a and 36b, the rotation of the rotary table 34 is braked (Step "D"). Since the carrying plate 10 is also rotated at high speed, the mark 12 passes the sensor detecting the mark 12. Then, the control unit 38 checks if the sensors 36a and 36b detect no mark 12 or not (Step "E").

If one of the sensors 36a and 36b once detected the mark 12 then missed the mark 12, the rotation of the rotary table 34, on which the carrying plate 10 is held, is completely stopped (Step "F").

Next, the control unit 38 rotates the rotary table 34, in the reverse direction (Step "G"). The control unit 38 checks if the mark 12 is detected by the sensor, which previously detected the mark 12, or not (Step "H"). If the mark 12 is detected by the sensor, the reverse rotation of the rotary table 34 is stopped (Step "I"). Influence of inertia can be reduced by reducing the rotational speed of the rotary table 34 and the carrying plate 10. By rotating the carrying plate 10 at lower speed, the carrying plate 10 can be correctly stopped at desired position on the basis of the mark 12.

In the present embodiment, the mark 12 can be indexed by two mark detecting means 36a and 36b, so that required time for indexing the wafer adhering positions can be shortened and manufacturing efficiency can be improved.

Next, the control unit 38 checks which sensor detects the mark 12 (Step "J"). If the sensor 36a detects the mark 12, the control unit 38 reads position correcting data of the sensor 36a and position data of the first wafer adhering position (Step "K"). On the other hand, if the sensor 36b detects the mark 12, the control unit 38 reads position correcting data of the sensor 36b and the position data of the first wafer adhering position (Step "L").

In Step "M", the carrying plate 10 is stayed at the present position on the basis of the data read in the Step "K" or "L" or rotated (shifted) prescribed angle so as to coincide the first adhering position of the carrying plate 10 with the adhering head 30. Then, the control unit 38 checks if the first wafer 20 is correctly prepared or not (Step "N").

Upon completing the indexing action for the first wafer 20, the first wafer 20 is adhered onto the first initial wafer adhering position of the carrying plate 10 by the adhering head 30. To adhere the following wafers 20, the carrying table is rotated to index the initial wafer adhering positions of the following wafers 20. The following wafers 20 are respectively adhered onto the rest initial wafer adhering positions, in order, with regular angular spaces by the adhering head 30 whose position is fixed.

In the next cycle, the above described steps are repeated until the mark 12 or the standard position of the carrying plate 10 stops at the desired position. In the case that the wafer adhering positions are fixed positions, the action of the first cycle is repeated.

On the other hand, in the case of regularly shifting the wafer adhering positions, the carrying plate 10 is angularly shifted the prescribed angle. With this action, the first wafer adhering position of the wafer 20a (see FIG. 4) is angularly shifted the prescribed angle from the first initial wafer adhering position of the first cycle. The wafer adhering positions of the following wafers 20a are indexed, and the following wafers 20a are adhered thereonto as well as the first cycle.

By repeating the above described cycle, the wafer adhering positions, with respect to the standard position, can be regularly angularly shifted in the surface of the carrying plate 10.

By repeating the above described cycle, each wafer adhering position is gradually angularly shifted and reaches the adjacent initial wafer adhering position. When each wafer adhering position reaches the adjacent initial adhering position, the adhering positions are respectively returned to their initial adhering positions. By returning to the initial adhering positions, the wafers can be efficiently adhered.

The wafer adherng device of the present embodiment has a plurality of the mark detecting means, but the wafers are adhered by the method of the First, Sixth or Seventh Embodiment. However, the method of adhering is not limited to the First, Sixth or Seventh Embodiment. The methods of the Second to Fourth Embodiments can be employed in the present device. In the present device, the methods of the Second to Fourth Embodiments can be employed by changing a control program of the positioning unit 40.

By shifting the wafer adhering positions, the whole surface of the carrying plate 10 can be used. So the present embodiment has following advantages: the surface condition of the carrying plate 10 can be uniformly maintained; the span of life of the carrying plate 10 can be extended; the wafers 20 can be stably adhered; the wafer adhering action can be executed automatically; and the wafers 20 can be identified, by regularly shifted the wafer adhering positions in a prescribed pattern, so as to respectively manage the wafers.

The method and the device of the present invention can be applied to not only polishing machines but also lapping machines.

The wafers of the embodiments are circular silicon wafers, but the method and the device of the present invention can be applied to adhere other materials, e.g., glass plates, and non-circular materials.

If three or more mark detecting means are provided, working efficiency can be improved.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A wafer adhering system for adhering a plurality of wafers onto a surface of a carrying plate with predetermined spaces, comprising:
   an adhering head positioning the wafers at wafer adhering positions on the surface of said carrying plate, said adhering head pressing the wafers onto said carrying plate;
   an adjusting mechanism being capable of adjusting relative positional relationship between said adhering head and said carrying plate;
   a mark being provided at a standard position of said carrying plate;
   a sensor detecting said mark; and
   a control unit detecting the standard position of said carrying plate by said sensor, said control unit controlling said adjusting mechanism so as to regularly shift the wafer adhering positions with respect to the standard position of said carrying plate.

2. The wafer adhering system according to claim 1, wherein said mark includes an identification code for individually identifying said carrying plate.

3. The wafer adhering system according to claim 1, wherein said adjusting mechanism includes a rotary table for holding and rotating said carrying plate.

4. A wafer adhering system for adhering a plurality of wafers onto a surface of a carrying plate with predetermined spaces, comprising:
   an adhering head positioning the wafers at wafer adhering positions on the surface of said carrying plate, said adhering head pressing the wafers onto said carrying plate;
   a rotary mechanism including a rotary table for holding and rotating said carrying plate, said rotary mechanism detecting and adjusting relative positional relationship, in the circumferential direction of said carrying plate, between said adhering head and said carrying plate;

a mark being provided at a standard position of said carrying plate;

a plurality of mark detecting means for detecting said mark; and a control unit detecting the standard position of said carrying plate by one of said mark detecting means, said control unit controlling said rotary mechanism so as to index the wafer adhering positions on said carrying plate.

5. The wafer adhering system according to claim 4, wherein an even-number of said mark detecting means are symmetrically arranged with respect to said carrying plate.

6. The wafer adhering system according to claim 4, wherein said mark includes an identification code for individually identifying said carrying plate.

7. A wafer adhering system for adhering wafers onto a surface of a carrying plate, comprising:

an adhering head for positioning the wafers at wafer adhering positions on the surface of said carrying plate;

an adjusting mechanism for adjusting a relative positional relationship between said adhering head and said carrying plate;

a position detector for detecting a position of said carrying plate; and a control unit accepting output from the position detector and controlling said adjusting mechanism to repeatedly shift the wafer adhering positions on said carrying plate by adjusting the relative positional relationship between said adhering head and said carrying plate based on the output of the position detector.

8. The wafer adhering system according to claim 7, wherein the position detector includes:

a mark indicating a standard position of said carrying plate; and a sensor detecting said mark.

9. The wafer adhering system according to claim 7, wherein said mark is provided on said carrying plate.

10. The wafer adhering system according to claim 9, wherein said mark includes an identification code for individually identifying said carrying plate.

11. The wafer adhering system according to claim 8, wherein said mark includes an identification code for individually identifying said carrying plate.

12. The wafer adhering system according to claim 8, wherein said position detector reads an identification code for individually identifying said carrying plate.

13. The wafer adhering system according to claim 8, wherein said adjusting mechanism includes a rotary table for holding and rotating said carrying plate.

14. The wafer adhering system according to claim 8, wherein said adjusting mechanism includes a rotary mechanism having a rotary table for holding and rotating said carrying plate, said rotary mechanism determining the relative positional relationship in the circumferential direction of said carrying plate between said adhering head and said carrying plate and adjusting the relative positional relationship.

15. The wafer adhering system according to claim 14, wherein the position detector includes:

a mark relating a standard position of said carrying plate; and at least two mark detecting means for detecting said mark.

16. The wafer adhering system according to claim 15, wherein said control unit determines the standard position of said carrying plate based on output of one of said at least two mark detecting means, and said control unit controls said rotary mechanism so as to index the wafer adhering positions on said carrying plate to effect shifting of the wafer adhering positions.

17. The wafer adhering system according to claim 16, wherein an even-number of said mark detecting means are symmetrically arranged with respect to said carrying plate.

* * * * *